US011527868B2

(12) United States Patent
Ghosh et al.

(10) Patent No.: US 11,527,868 B2
(45) Date of Patent: Dec. 13, 2022

(54) MULTILAYER CONDUCTOR INTERCONNECTS FOR HIGH DENSITY LIGHT EMITTER ARRAYS

(71) Applicant: Princeton Optronics, Inc., Mercerville, NJ (US)

(72) Inventors: Chuni Ghosh, West Windsor, NJ (US); Jean-Francois Seurin, Princeton Junction, NJ (US); Laurence Watkins, Pennington, NJ (US); Guoyang Xu, Mercerville, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 394 days.

(21) Appl. No.: 16/640,119

(22) PCT Filed: Aug. 21, 2018

(86) PCT No.: PCT/US2018/047342
§ 371 (c)(1),
(2) Date: Feb. 19, 2020

(87) PCT Pub. No.: WO2019/040506
PCT Pub. Date: Feb. 28, 2019

(65) Prior Publication Data
US 2021/0218231 A1    Jul. 15, 2021

Related U.S. Application Data

(60) Provisional application No. 62/548,789, filed on Aug. 22, 2017.

(51) Int. Cl.
*H01S 5/042* (2006.01)
*H01S 5/42* (2006.01)
(Continued)

(52) U.S. Cl.
CPC .......... *H01S 5/423* (2013.01); *H01S 5/02345* (2021.01); *H01S 5/04253* (2019.08);
(Continued)

(58) Field of Classification Search
CPC .. H01S 5/423; H01S 5/02345; H01S 5/04253; H01S 5/04256; H01S 5/18361; H01S 5/405; H01S 2301/176
See application file for complete search history.

(56) References Cited

U.S. PATENT DOCUMENTS 5,978,403 A   11/1999  Iwasa et al.
9,038,883 B2   5/2015  Wang et al.
(Continued)

FOREIGN PATENT DOCUMENTS

TW   200943653 A   10/2009
TW   201512680 A    4/2015
WO   2007105328 A1  9/2007

OTHER PUBLICATIONS

International Search Report for corresponding International Application No. PCT/US2018/047342 dated Jan. 10, 2019.
(Continued)

*Primary Examiner* — Yuanda Zhang
(74) *Attorney, Agent, or Firm* — Michael Best & Friedrich LLP

(57) ABSTRACT

A multilayer interconnect is described which enables electrically connecting a complex distribution of VCSEL or other light emitter elements in a large high density addressable array. The arrays can include many groups of VCSEL elements interspersed among each other to form a structured array. Each group can be connected to a contact pad so that each group of light emitter elements can be activated separately.

18 Claims, 6 Drawing Sheets

(51) Int. Cl.
    *H01S 5/02345*     (2021.01)
    *H01S 5/183*     (2006.01)
    *H01S 5/40*     (2006.01)

(52) U.S. Cl.
    CPC ...... *H01S 5/04256* (2019.08); *H01S 5/18361* (2013.01); *H01S 5/405* (2013.01); *H01S 2301/176* (2013.01)

(56) References Cited

U.S. PATENT DOCUMENTS

| | | |
|---|---|---|
| 2003/0026303 A1 | 2/2003 | Ouchi |
| 2008/0205462 A1 | 8/2008 | Uchida |
| 2013/0272330 A1 | 10/2013 | Joseph et al. |
| 2013/0308672 A1 | 11/2013 | Pan et al. |
| 2014/0218898 A1 | 8/2014 | Seurin et al. |
| 2015/0063393 A1 | 5/2015 | Iwata et al. |
| 2015/0303655 A1 | 10/2015 | Han et al. |
| 2016/0072258 A1 | 3/2016 | Seurin |
| 2016/0352074 A1* | 12/2016 | Hogan .................. H01S 5/022 |
| 2019/0109436 A1 | 4/2019 | Hegblom |

OTHER PUBLICATIONS

Extended Search Report issued from the European Patent Office for related Application No. 18847374.8 dated Apr. 23, 2021 (7 Pages).
Office Action issued from the Taiwan Patent Office for related Application No. 107129159 dated Apr. 28, 2022 (9 Pages including the Statement of Relevance).

* cited by examiner

MULTILAYER CONDUCTOR INTERCONNECTS FOR HIGH DENSITY LIGHT EMITTER ARRAYS

FIELD OF THE DISCLOSURE

The present disclosure relates to multilayer conductor interconnects for high density light emitter arrays.

BACKGROUND

There are many new applications of vertical cavity surface emitting laser ("VCSEL") and other light emitter arrays in the area of three-dimensional ("3D") imaging and sensing. VCSELs and VCSEL arrays, for example, can be used for time-of-flight ("TOF") distance measurement, stereo illumination and structured light illumination. In the latter applications, structured light illumination including specially designed structured light patterns is projected into a scene to illuminate objects in the scene with an array of spots. A sensor is used to analyze an image of the objects with the structured light pattern and determine 3D information about the objects and their location. Applications of this technique include, but are not limited to, auto-focusing cameras and computer gaming systems. Other major applications are for self-driving vehicles and automatic transportation control.

VCSELs can be fabricated in large arrays with the array structure comprising many forms and layouts. In simple illuminators, all the VCSEL elements are activated together and the output beams projected to form the structured illumination pattern. There are many applications, however, that require subsets of the VCSEL elements to be activated separately. These subsets can be in distinct groups or the VCSEL elements can be distributed such that the VCSELs of one group are interspersed among the VCSELs of the other groups. The electrical connection of distinct groups is relatively straight forward and can be accomplished, for example, using the top conducting layer and routing different sections to different connection pads at the edge of the array substrate.

The interconnection becomes much more complex in arrangements where the VCSELs from each group are interspersed among one another. The individual connections have to be routed between the various VCSELs, making it difficult to fabricate large dense arrays of VCSELs.

SUMMARY

This disclosure describes optical modules for light projection and three-dimensional ("3D") imaging and, in particular, to miniature optical light sources and modules for producing passive and dynamic structured light patterns for 3D imaging, gesture recognition and other applications where small form factor illumination sources are required using arrays, including addressable arrays of light emitters, including surface emitting light sources such as VCSELs.

For example, one aspect describes a device for generating high density illumination patterns. The device includes an array of light emitting elements on a common substrate, a common electrical contact on a bottom substrate side of the light emitting elements, and a stack of multiple conductor patterns disposed over the array. The conductor patterns are isolated electrically from one another, and each of the conductor pattern contacts respective electrical contact regions of the light emitting elements of a respective subset within the array. Electrical contact pads are disposed at a periphery of the array. Each of the conductor patterns is electrically connected respectively to at least one of the electrical contact pads, and at least one of the conductor patterns crosses over another one of the conductor patterns.

In accordance with another aspect, the disclosure describes a device for generating high density illumination patterns. The device includes an array of light emitting elements on a common substrate, each light emitting element including a respective bottom reflector on a substrate side and a top reflector on another side of the light emitting element. The device further includes a common electrical contact on a bottom substrate side of the light emitting elements. A first dielectric layer is on the array of light emitting elements, wherein the first dielectric layer covers the substrate and light emitting elements except for a top electrical contact region of each light emitting element. A first top conductor pattern is on the first dielectric layer and contacts the respective top electrical contact regions of a first subset of the light emitting elements. A sequence of at least one additional dielectric layer and at least one additional top conductor pattern is disposed such that the top electrical contact regions of respective subsets of light emitting elements are connected to a respective one of the at least one additional top conductor patterns. Electrical contact pads are disposed at a periphery of the array, wherein each of the first top conductor pattern and the additional top conductor patterns is electrically connected respectively to one or more of the electrical contact pads.

In some implementations, the array of light emitting elements comprises an array of surface emitting elements, for example, an array of VCSELs.

This disclosure provides a solution to the complex interconnection problem of large, addressable light emitter (e.g., VCSEL) arrays with interspersed elements. Multiple layers of conductors are provided to connect, for example, VCSELs and route the connections to contact pads at the periphery of the VCSEL array. Each conductor layer can be used to connect a subset of one or more VCSEL elements in the array and route the connections to the peripheral contact pads. This means that conductors are not restricted to being routed side-by-side, but can be placed on top of one another so that, for example, with five layers, five conductors can be placed in the same lateral space as one conductor would be located if the standard VCSEL technology were employed.

The multilayer conductor structure also allows conductors in one layer to cross over conductors in other layers, thereby greatly increasing the interconnect flexibility and complexity. This feature can be critical in connecting large arrays of VCSELs where the different groups have VCSEL elements interspersed among one another. Each conductor layer is separated from the others, for example, by an insulating dielectric layer. Suitable dielectric materials include silicon nitride, silicon oxide, polymers such as polyimide, and other insulating materials.

Some implementations use transparent conducting layers. This feature can enable the conductors to be placed over the emitting regions of VCSELs without blocking the output light beams.

The principles described in this disclosure are applicable not only to VCSEL arrays, but to arrays of other types of light emitting elements (e.g., LED or resonant LED arrays) and can be particularly advantageous, for example, if the light emitting elements need to be addressable and have complex array layouts.

The light emitting elements in the array can be activated so as to illuminate a scene, for example, with a structured distribution of spots. Multiple different spot structures can be formed by separately activating each group of elements in the array.

Other aspect, features and advantages will be readily apparent from the following detailed description, the accompanying drawings, and the claims.

DETAILED DESCRIPTION

Figure 1:
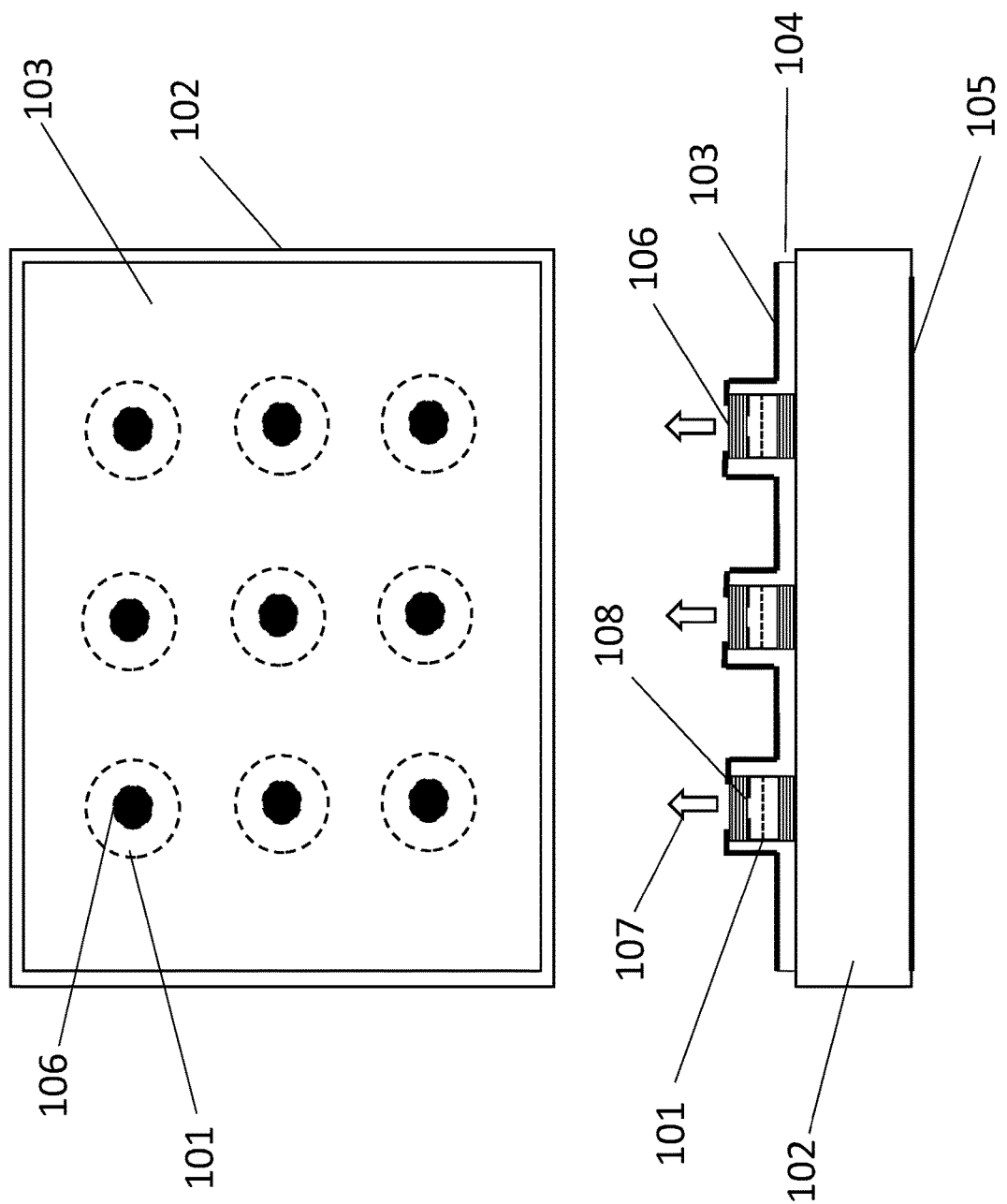
FIG. 1 illustrates an example of a VCSEL array which has a common bottom contact on the bottom side of the substrate and a single layer top contact which contacts all the VCSEL elements in the array.

As shown in FIG. 1, a top emitting VCSEL array includes VCSEL elements 101 each of which comprises a resonant optical cavity formed by a bottom distributed Bragg reflector ("DBR") (e.g., mirror) in contact with a substrate 102 and a top DBR reflector. In between the reflectors in the resonant cavity, a gain section comprises multiple quantum well structures that provide optical gain when activated by an electrical current. Near the gain section, a current confining aperture 108 is provided to concentrate the current in the center of the VCSEL structure to create high gain in the quantum wells.

As further shown in FIG. 1, two conductors 103, 105 deliver the activation current. The top conductor 103 is connected to the top contact on the top DBR reflector. The current flows through the top DBR reflector, through the aperture and gain section, through the bottom DBR into the substrate 102. The substrate is electrically conducting so that the current can flow through the substrate to the bottom contact and conductor 105. A dielectric electrically insulating layer 104 is fabricated on the substrate and lower parts of the VCSEL elements to isolate the current in the top conductor 103 from being shorted to the bottom contact 105 through the substrate or through the side of the VCSEL elements.

The VCSEL array in FIG. 1 is a top emitting VCSEL array, and the top DBR reflector (e.g., mirror) is made partially reflecting so that the output beam 107 is transmitted out of the top surface 106.

In a bottom emitting VCSEL, the bottom DBR is made partially reflecting and the output beam is transmitted through the substrate and out of the bottom of the VCSEL array. Apertures are formed in the bottom conductor 105 to allow the beam to be transmitted. Other variants of VCSELs include three mirror types in which one of the DBR mirrors is divided into two parts, and a spacer placed between them. These features change the properties of the optical resonator so as to modify the characteristics of the output beam. All these variants have the common electrical components of a top contact and bottom contact for delivering activation current into the quantum wells in the gain section, including through a confining aperture(s).

Figure 2:
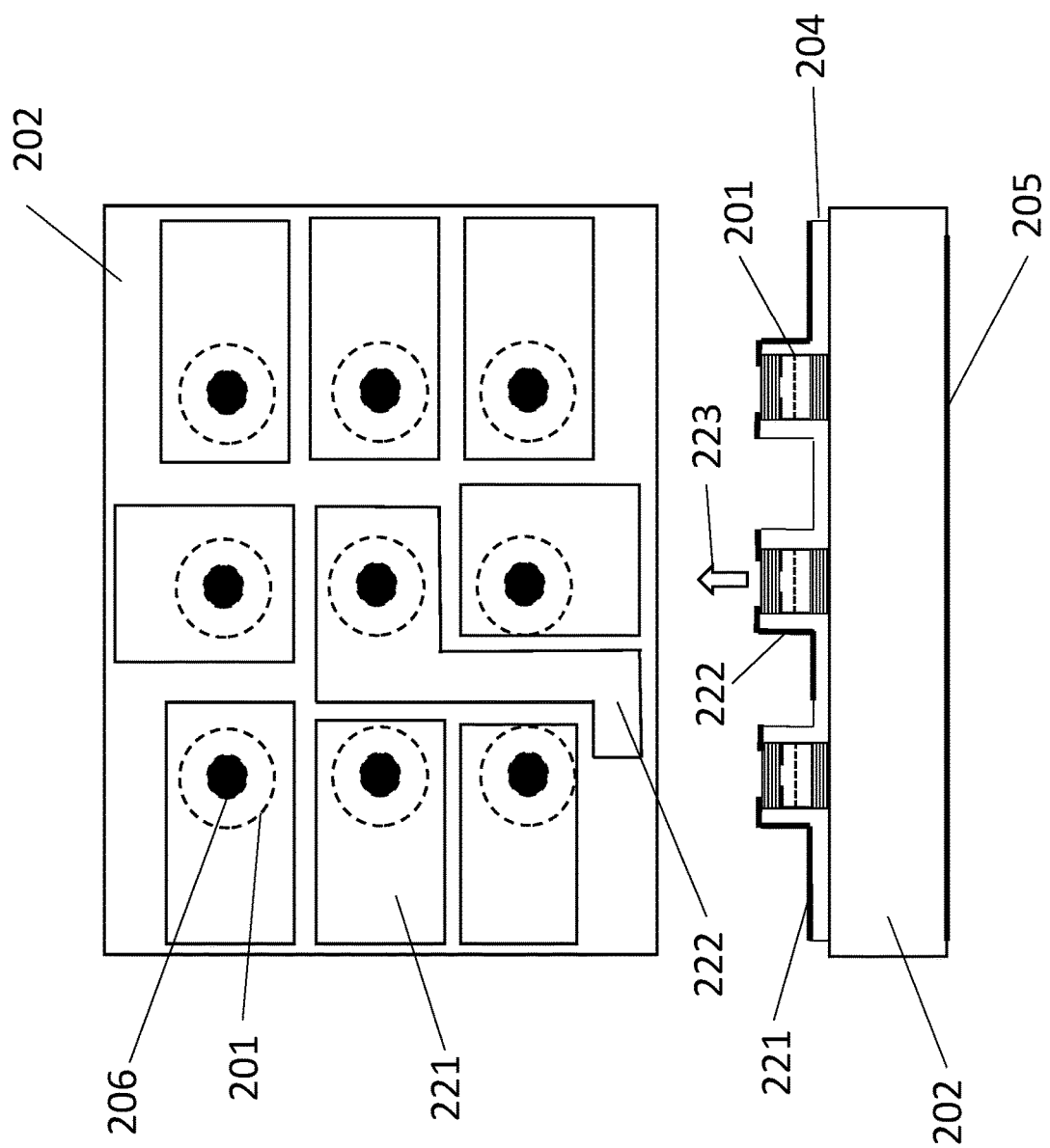
FIG. 2 shows an example of a VCSEL array having separate top contacts to each VCSEL element to provide an addressable VCSEL array.

In FIG. 1, all the VCSEL elements are connected to a common top conductor so that applying current activates all the VCSELs at once. FIG. 2 illustrates an addressable VCSEL array in which each VCSEL element 201 is connected to a separate top conductor 221, 222. In this case, each VCSEL can be activated separately, for example, activating conductor 222 with the bottom conductor 205 generates an output beam 223 from the center VCSEL. Thus one, several or all VCSEL elements can be activated as needed. All of the conductors are coupled to pads at the edge of the substrate 202. This feature is needed so that connections off the VCSEL array chip to a submount or printed circuit board ("PCB") can be made around the edge of the chip by wire bonding or another electrical connection technique.

For small VCSEL arrays as shown in FIG. 2, the arrangement of the conductors and routing them to the edge of the chip is relatively straightforward and not complex. However, for larger arrays, the arrangement becomes very complex. In addition, instead of one conductor being routed between VCSELs, two or more conductors may be required to connect the VCSELs in the center region of the array to pads at the periphery of the chip. Such requirements make it difficult to design and fabricate a dense structured illumination array pattern containing a high number of addressable VCSEL elements or groups of elements.

The foregoing problem can be solved, as explained in greater detail below, by providing multiple layers of top conductors. In this way, conductors need not be restricted to being routed side-by-side, but can be placed on top of each other so that with multiple (e.g., five) layers, multiple (e.g., five) conductors can be placed in the same lateral space as would be occupied by only one conductor in the case of standard VCSEL technology.

Figure 3:
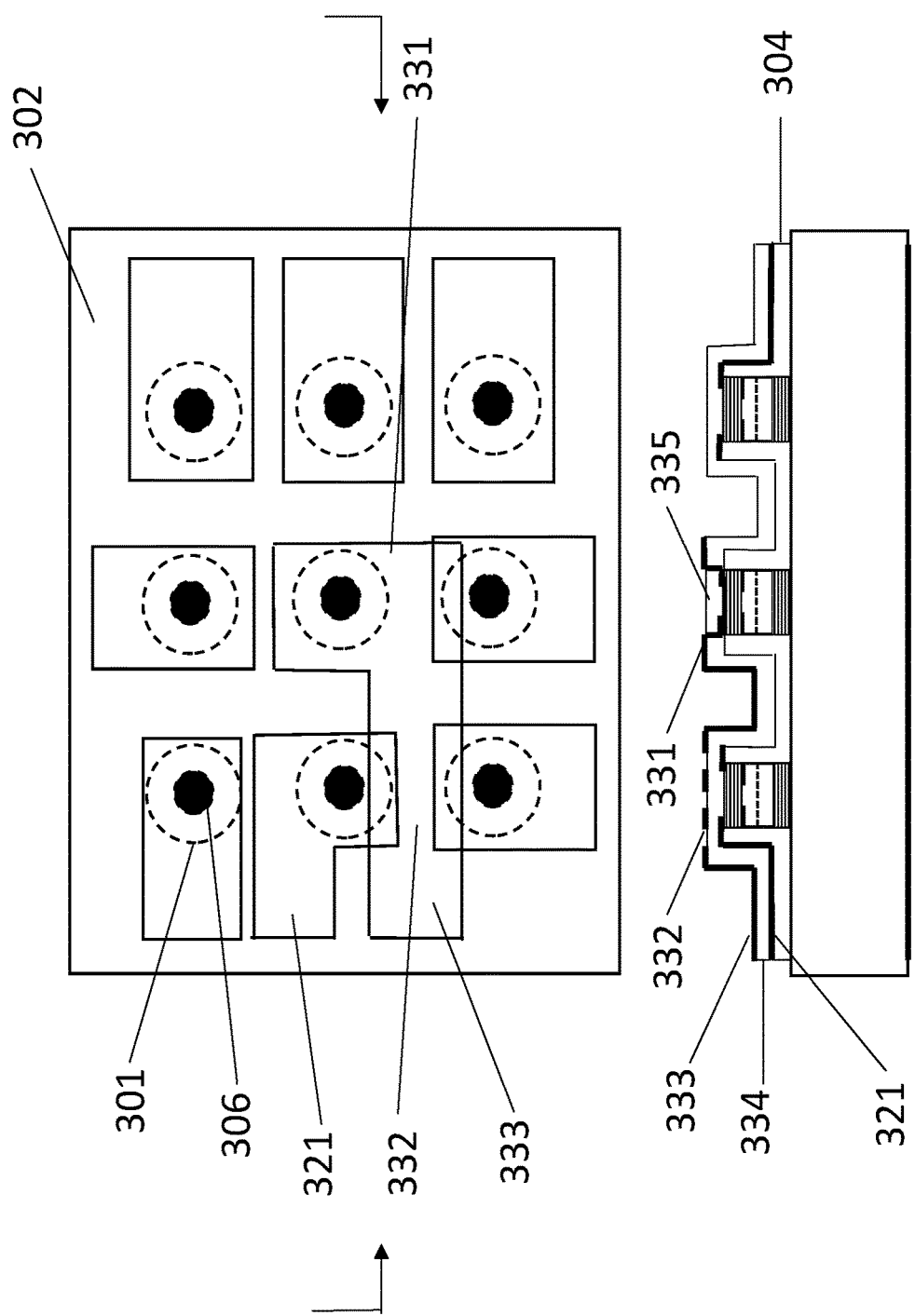
FIG. 3 is an example in which two layers of top conductors are used to connect to the VCSEL, element top contacts, and a dielectric layer is used between the conductor layers to isolate them electrically.

FIG. 3 illustrates a two layer conductor arrangement in which two top conductor levels are employed. The lower, first layer 321 can be the same configuration as for a standard VCSEL. The top conductor 321 is connected to the VCSEL 301 top contact and routed to the edge of the substrate. A dielectric insulating layer 304 isolates the conductor 321 from the substrate and sides of the VCSEL.

A second insulating dielectric layer 334 is deposited on top of the first conductor layer 321. The dielectric layer 334 can be optically transmitting to allow for transmission of the output beam from VCSELs connected to the first conductor layer 321. Holes 335 are formed in this dielectric layer 334 at the location of the top contacts of the VCSEL elements which are to be connected to the second conductor layer 331. A second conductor layer 331 is provided on top of this second dielectric layer 334. The second conductor 331 contacts the VCSEL top contact through the hole 335, and is routed to the edge 333 of the substrate. Since the conductor 331 typically is optically opaque, the conductor 331 is routed along a path 332 so that it does not block any output beams from other VCSEL elements 306. Examples of materials that can be used for the dielectric layers 304, 334 include silicon nitride, silicon dioxide, and polymers such as polyimide.

Figures 4A, 4B:
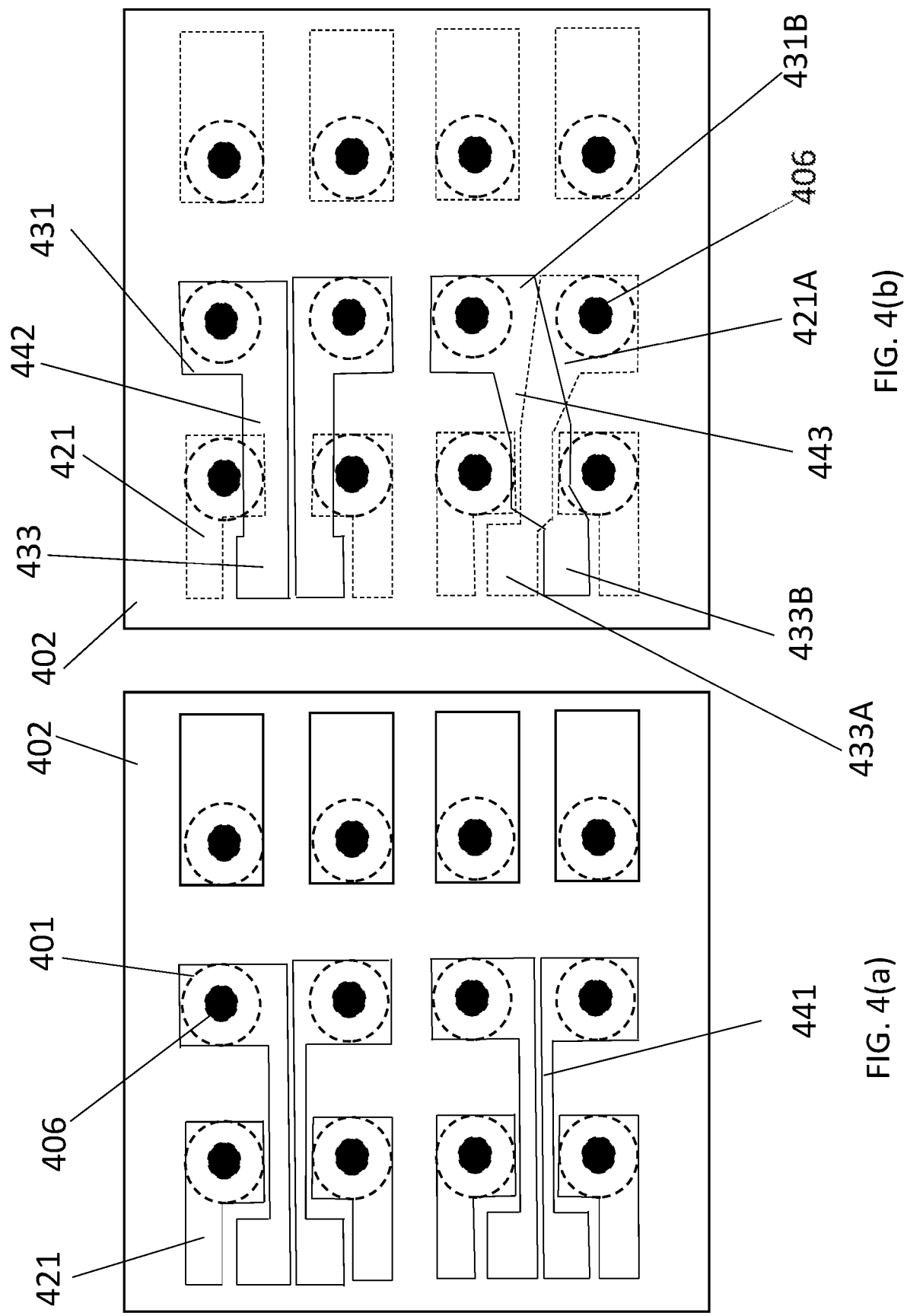
FIGS. 4(a) and 4(b) show a side-by-side comparison of connectivity arrangement for a single layer conductor (FIG. 4(a)) and a two layer conductor (FIG. 4(b)).

FIGS. 4(a) and 4(b) show a comparison of the connection of individual VCSELs 406 in an addressable array using single layer conductors (FIG. 4(a)) and two level conductors (FIG. 4(b)). FIG. 4(a) illustrates an example of a VCSEL array using single layer top conductor pattern in which the conductors 421 for the outer VCSEL elements can be routed easily to pads at the edge of the substrate 402. However, to route conductors 441 from the inner VCSELs toy the edge of the substrate 402, the conductors 441 have to be routed in between adjacent ones of the outer VCSELs. As indicated by FIG. 4(a), this limitation results in very narrow conductors 441, which limits the amount of current that can be applied. In addition, the VCSELs 406 have to be spaced further apart to provide room for the conductors 441 from the inner VCSELs. For a small array, this spacing might be accomplished with minor difficulty. However, for large arrays, this spacing becomes extremely difficult, and in some cases impossible, to achieve. The spacing requirement also limits the layout of the VCSEL array and its connectivity.

In contrast, FIG. 4(b) illustrates some of the potential benefits of using two layer conductors 421, 431 to connect the VCSEL array elements. One potential benefit, as shown in the upper part of the figure, is that conductors 431 having relatively wide portions 442 can be used to connect the inner VCSELs to the pads 443 at the edge of the substrate 402. The upper conductors 431 can pass over the lower conductors 421 because they are isolated from each other by the second dielectric insulating layer (not shown in FIG. 4(a). This means that, for even for large arrays, the VCSEL elements can be located closer together than would otherwise be possible.

A second potential benefit is that conductor cross-overs can be used where one conductor crosses the other conductor to a connection on the other side. This is shown in the lower part of FIG. 4(b). In this example, a first one of the inner VCSELs is connected to a first pad 433A at the edge of the substrate 402 using the lower first conductor layer 421A. A second inner VCSEL is connected to another second pad 433B using the second layer conductor 431B. In this case, the second pad 433B is located above the first pad 433A. The conductor 431B passes over the lower conductor 421A and connects to the upper pad 433B by way of a portion 443 of the conductor 431B. This capability can be important for creating structured arrays where there is a need to interleave or intersperse VCSEL elements and activate them individually or in groups.

In the foregoing examples, the upper conductor layer is assumed to be opaque to the emitted optical beam from the VCSELs. To accommodate this feature, the conductors 431, 431B are routed so they do not pass over the VCSEL emitting areas 406. It was noted above that for bottom emitting VCSELs, the bottom common conductor has apertures to allow transmission of the output beams. However, if a transmissive electrical conductor material, such as indium tin oxide, is used for the upper conductor layer, this restriction no longer applies, and the conductors can pass directly over the VCSEL emitting region(s) 406. An example of such an implementation is shown in FIG. 5.

Figure 5:
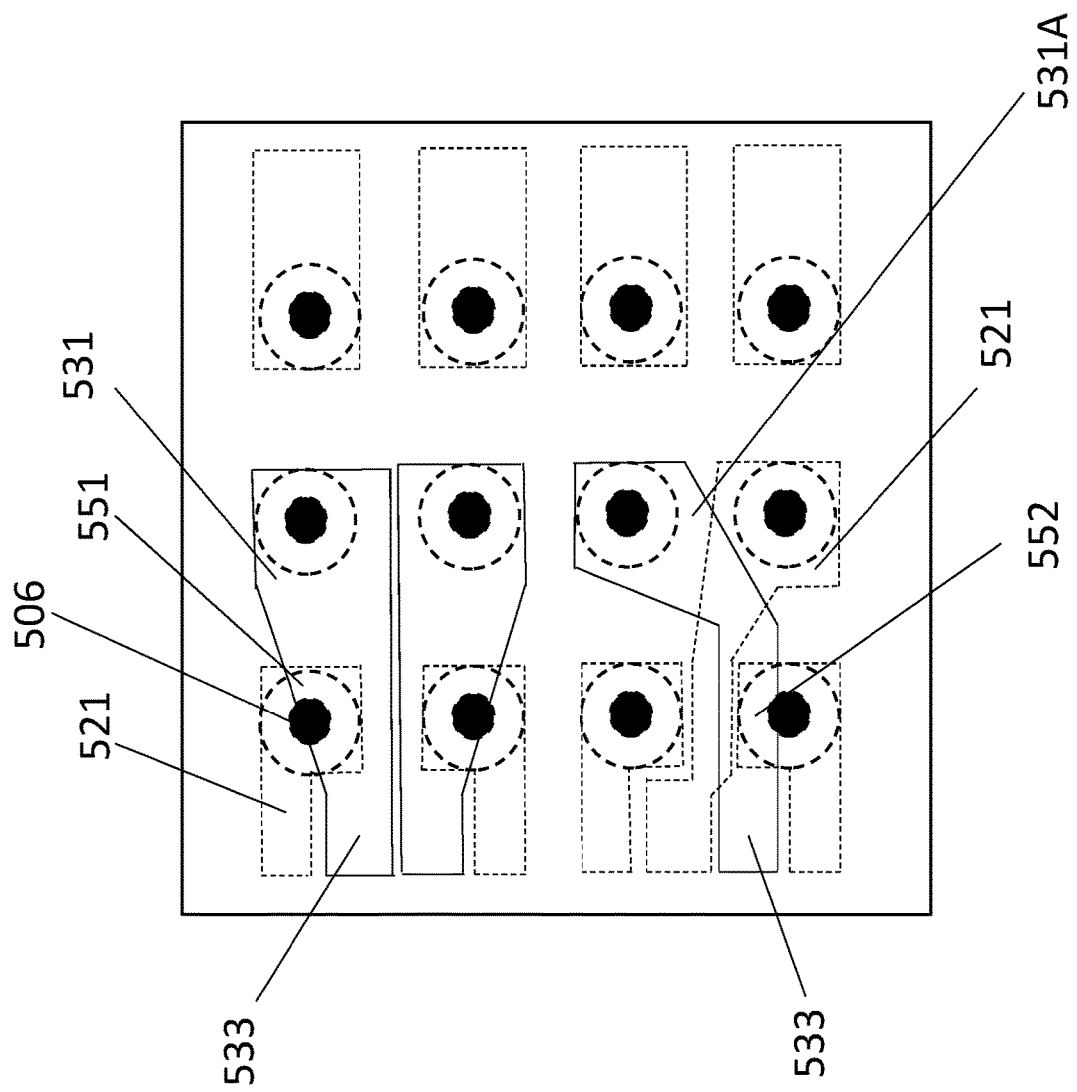
FIG. 5 shows an example of a multilayer conductor connection of VCSEL elements using transparent conductor material such that conductors can pass over the emission area of another VCSEL without impeding output beam transmission.

As shown in FIG. 5, a section 551 of the upper transmissive conductor 531 can pass over the VCSEL emitting region 506 and yet will not block the VCSEL output beam. In this case, the dielectric layer 334 also needs to be transmissive for the output beam wavelength. This also applies to cross-over situations where a section 552 of the upper transmissive conductor 531A passes over the emitting region of the VCSEL. This applies to second and higher number conductors where an isolating dielectric layer is placed over the VCSEL contact and emitting regions. A lower or first conductor 521, however, cannot pass over another VCSEL because the conductor 521 would touch the contact of that VCSEL.

The foregoing discussion describes two-layer top conductor VCSEL connections and how it results in increased flexibility for electrically connecting VCSEL elements in an array. Such multi-top conductor VCSEL connections can be expanded to more than two top conductor layers. The same principles can be used to provide, three, four, five or even more top conductor layers for connecting single VCSEL elements or groups of VCSEL elements, and for routing these connections to contact pads at the periphery of the VCSEL array substrate. To provide additional top conductor VCSEL connections, an additional insulating dielectric layer is provided over the previous top conductor layer, and then another top conductor layer is provided on the additional insulating dielectric layer. This process can be repeated to provide as many conductor layers as is needed for different subgroups of the VCSELs. Also, in addition to connecting a VCSEL element to a pad at the periphery of the substrate, the multilayer interconnections also can be used to form connections between VCSELs to form interconnected groups and can be used to connect the VCSELs to other electrical elements on the substrate.

Figure 6:
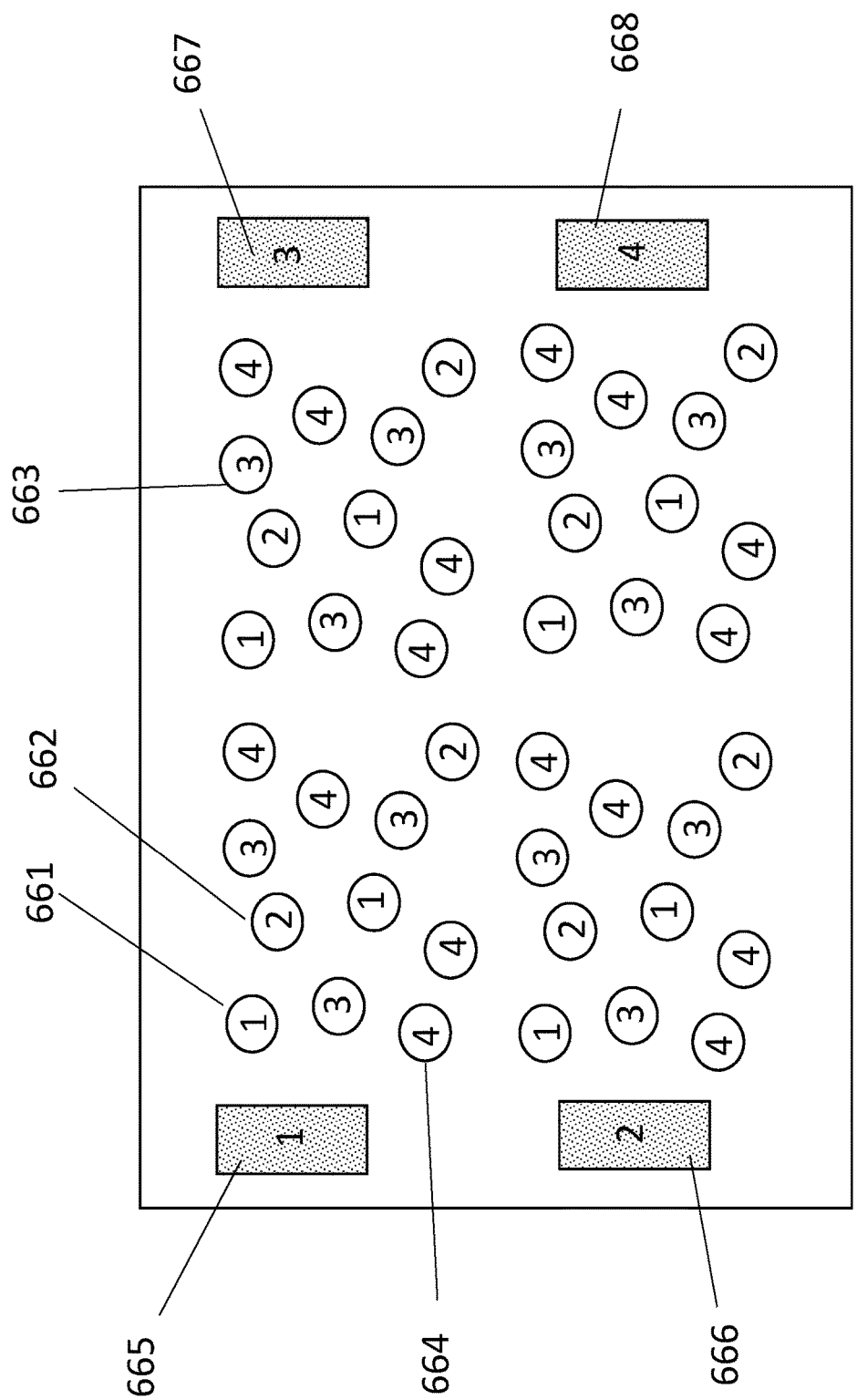
FIG. 6 illustrates how multiple conductor layers can be used to provide a VCSEL array where multiple different sets of VCSEL elements can be activated independently to form multiple different structured illumination patterns.

FIG. 6 shows an example of a structured light VCSEL array illuminator in which the VCSELs elements are laid out in a non-regular array structure. In the illustrated arrangement, the VCSELs are connected in four groups. VCSELs 661 (marked "1") form group 1 and are connected to a contact pad 665 at the edge of the substrate. The other groups are connected in a similar manner (i.e., VCSELs 662, 663, 664, labelled respectively as "2," "3," "4," are connected, respectively, to pads 666, 667, 668). One arrangement for achieving the connections is to use four top conductor layers such that each group of VCSELs is connected using a respective one of the layers. It would be extremely difficult to connect such an arrangement of VCSEL elements using a single layer conductor because the VCSEL elements belonging to each particular subgroup do not form a cohesive group, but are interspersed amongst VCSELs of the other groups.

Principles of this disclosure may be applied to construct a wide range of very compact structured light illuminators, optical sub-assemblies and optical modules. VCSEL array devices may be constructed for multi-wavelength application, such as a RBG or white light source. The multilayer conductor connection for compact dense VCSEL arrays is highly suitable for handheld devices for various applications and for volume production, reliability and lower cost. These and other advantages of the principles disclosed here will be apparent to those skilled in the art.

Further, the principles described above are applicable not only to VCSEL arrays, but to arrays of other types of light emitting elements (e.g., LED or resonant LED arrays). Such techniques can be particularly advantageous, for example, if the light emitting elements need to be addressable and have complex array layouts.

A framework of the principles is presented in the preceding paragraphs by describing various aspects of this disclosure using exemplary implementations that are represented in different drawings. For clarity and ease of description, each illustrated implementation includes only particular aspects. In general, different aspects of the different implementations can be practiced as shown, or different aspects described in connection with different implementations can be practiced in combinations and sub-combinations. Other combinations and sub-combinations of the representative embodiments within the broad framework of this disclosure, but not explicitly shown or described, including those that may be apparent to those skilled in the art, are included within the scope of this disclosure. Further, various variations and modifications will be readily apparent to persons of ordinary skill in the art. Thus, other implementations are within the scope of the claims.

What is claimed:

1. A device for generating high density illumination patterns, the device comprising:
   an array of light emitting elements on a common substrate, each light emitting element including a respective bottom reflector on a substrate side and a top reflector on another side of the light emitting element;
   a common electrical contact on a bottom substrate side of the light emitting elements;
   a first dielectric layer on the array of light emitting elements, the first dielectric layer covering the substrate and light emitting elements except for a top electrical contact region of each light emitting element;
   a first top conductor pattern on the first dielectric layer and contacting the respective top electrical contact regions of a first subset of the light emitting elements;
   a sequence of at least one additional dielectric layer and at least one additional top conductor pattern disposed such that the top electrical contact regions of respective subsets of light emitting elements are connected to a respective one of the at least one additional top conductor patterns; and
   electrical contact pads at a periphery of the array, wherein each of the first top conductor pattern and the additional top conductor patterns is electrically connected respectively to one or more of the electrical contact pads.

2. The device of claim 1 wherein the array of light emitting elements comprises an array of surface emitting elements.

3. The device of claim 1 wherein the array of light emitting elements comprises an array of VCSELs.

4. The device of claim 3 wherein the VCSELs include three-mirror configuration VCSELs.

5. The device of claim 1 wherein the light emitting elements are top emitting VCSELs and wherein each of the at least one additional dielectric layer is optically transparent and covers emission regions of the VCSELs.

6. The device of claim 1 wherein the light emitting elements are top emitting VCSELs and wherein at least one additional top conductor layer is optically transparent and is routed over emission regions of the VCSELs.

7. The device of claim 1 wherein the sequence of at least one additional dielectric layer and at least one additional top conductor pattern includes:
   a first additional dielectric layer on the first top conductor pattern;
   a first additional top conductor pattern on the first additional dielectric layer and contacting the respective top electrical contact regions of a second subset of the light emitting elements;
   a second additional dielectric layer on the first additional top conductor pattern; and
   a second additional top conductor pattern on the second additional dielectric layer and contacting the respective top electrical contact regions of a third subset of the light emitting elements.

8. The device of claim 7 wherein the sequence of at least one additional dielectric layer and at least one additional top conductor pattern further includes:
   a third additional dielectric layer on the second additional top conductor pattern; and
   a third additional top conductor pattern on the third additional dielectric layer and contacting the respective top electrical contact regions of a fourth subset of the light emitting elements.

9. The device of claim 8 wherein the sequence of at least one additional dielectric layer and at least one additional top conductor pattern further includes:
   a fourth additional dielectric layer on the third additional top conductor pattern; and
   a fourth additional top conductor pattern on the fourth additional dielectric layer and contacting the respective top electrical contact regions of a fifth subset of the light emitting elements.

10. The device of claim 1 arranged such that different subsets of the light emitting elements are activatable separately from other subsets of the light emitting elements.

11. The device of claim 10 arranged such that the light emitting elements of the different subsets are interspersed with one another.

12. A device for generating high density illumination patterns, the device comprising:
    an array of light emitting elements on a common substrate;
    a common electrical contact on a bottom substrate side of the light emitting elements;
    a stack of multiple conductor patterns disposed over the array, the conductor patterns being isolated electrically from one another, each of the conductor patterns contacting respective electrical contact regions of the light emitting elements of a respective subset within the array; and
    electrical contact pads at a periphery of the array, wherein each of the conductor patterns is electrically connected respectively to at least one of the electrical contact pads, and wherein at least one of the conductor patterns crosses over another one of the conductor patterns;
    wherein the conductor patterns are isolated electrically from one another by respective dielectric layers; and
    wherein at least one of the dielectric layers is optically transparent to radiation emitted by the light emitting elements and covers emission regions of the light emitting elements.

13. The device of claim 12 wherein multiple ones of the conductor patterns cross over other respective ones of the conductor patterns.

14. The device of claim 12 arranged such that different subsets of the light emitting elements are activatable separately from other subsets of the light emitting elements.

15. The device of claim 12 arranged such that different subsets of the light emitting elements are connected electrically via the conductor patterns to different ones of the electrical contact pads, and wherein the different subsets of the light emitting elements are disposed such that they are interspersed with one another.

16. The device of claim 12 wherein the array of light emitting elements comprises an array of surface emitting elements.

17. The device of claim 12 wherein the array of light emitting elements comprises an array of VCSELs.

18. The device of claim 12 wherein at least one of the conductor layers is optically transparent to radiation emitted by the light emitting elements and is routed over emission regions of the light emitting elements.

* * * * *